United States Patent
Seo et al.

(10) Patent No.: US 6,376,303 B1
(45) Date of Patent: Apr. 23, 2002

(54) METHOD OF MANUFACTURING A CAPACITOR HAVING OXIDE LAYERS WITH DIFFERENT IMPURITIES AND METHOD OF FABRICATING A SEMICONDUCTOR DEVICE COMPRISING THE SAME

(75) Inventors: Tae Wook Seo, Suwon; Jeon Sig Lim, Kyungki-do, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/499,295

(22) Filed: Feb. 7, 2000

(30) Foreign Application Priority Data

Aug. 25, 1999 (KR) .............................. 99-35499

(51) Int. Cl.$^7$ ......................................... H01L 21/8242
(52) U.S. Cl. ...................... 438/253; 438/255; 438/254; 438/396; 438/398
(58) Field of Search ................................ 438/239, 240, 438/241, 242, 243, 250, 251, 253, 254, 255, 386, 393, 394, 395, 396, 397, 398

(56) References Cited

U.S. PATENT DOCUMENTS

| | | | |
|---|---|---|---|
| 5,185,282 A | | 2/1993 | Lee et al. |
| 5,384,276 A | * | 1/1995 | Ogawa et al. ............... 438/254 |
| 5,656,536 A | | 8/1997 | Wu |
| 5,716,884 A | | 2/1998 | Hsue et al. |
| 5,763,286 A | * | 6/1998 | Figura et al. ............... 438/255 |
| 5,807,782 A | | 9/1998 | Koh et al. |
| 5,843,822 A | | 12/1998 | Hsia et al. |
| 5,877,052 A | | 3/1999 | Lin et al. |
| 5,913,119 A | | 6/1999 | Lin et al. |

* cited by examiner

*Primary Examiner*—Charles Bowers
*Assistant Examiner*—Jack Chen
(74) *Attorney, Agent, or Firm*—Volentine Francos, PLLC

(57) ABSTRACT

A method of manufacturing a capacitor having a high storage capacitance and a method of fabricating semiconductor devices incorporating the same include measures to ensure that the substrate and/or components of the device are not thermally damaged during the process of forming a sacrificial structure of doped oxide layers used as a form in producing the storage electrode of the capacitor. The oxide layers are formed over the substrate by LPCVD or PECVD, which processes can be carried out at a temperature of only about 400–600° C. Each one of an adjacent pair of the doped oxide layers has a different etching rate from the other as the result of a difference (type or amount) in impurities contained in the oxide layers. At least one hole is formed in the sacrificial structure to create a side wall of the sacrificial structure. The side wall is etched so that repeating tooth-like prominences and depressions are formed at the side wall as the result of the different etching rates of the oxide layers. Subsequently, a conductive layer, constituting the storage electrode of the capacitor, is formed over the side wall so that the prominences and depressions of the side wall are reproduced in the conductive layer. A silicon HSG layer can be formed on an inner wall surface or on all of the exposed surfaces of the storage electrode to further increase the storage capacitance.

12 Claims, 16 Drawing Sheets

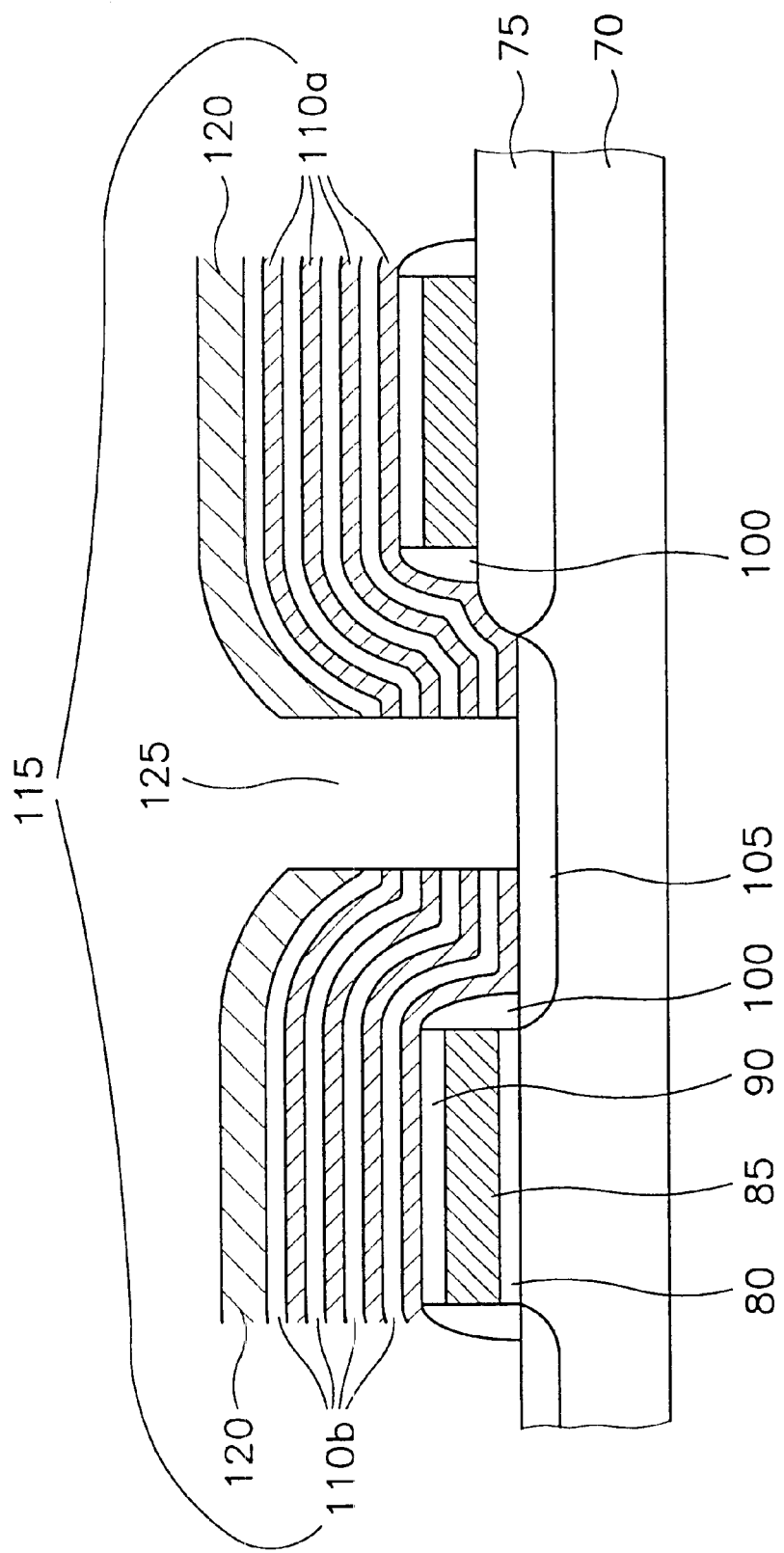

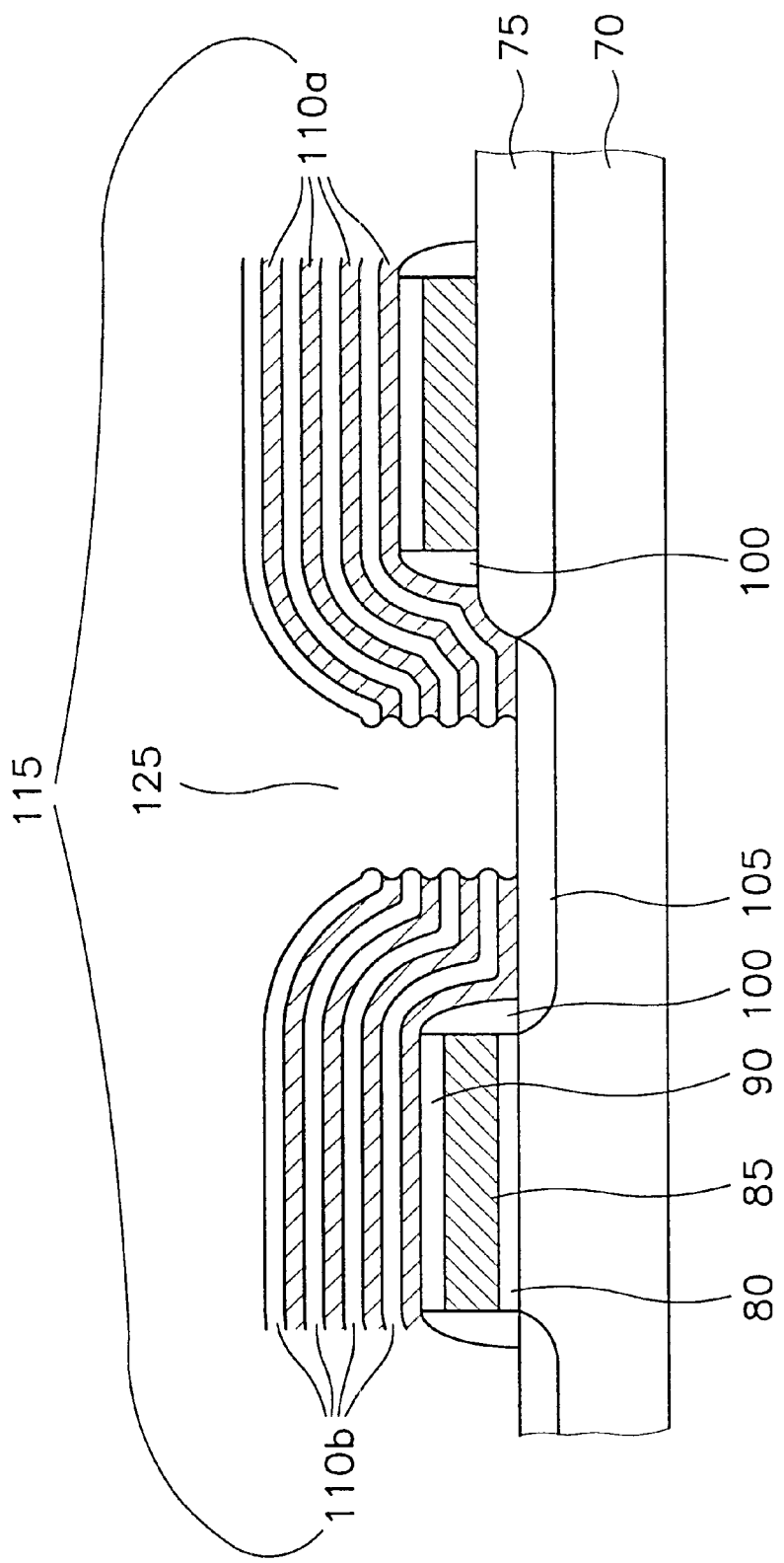

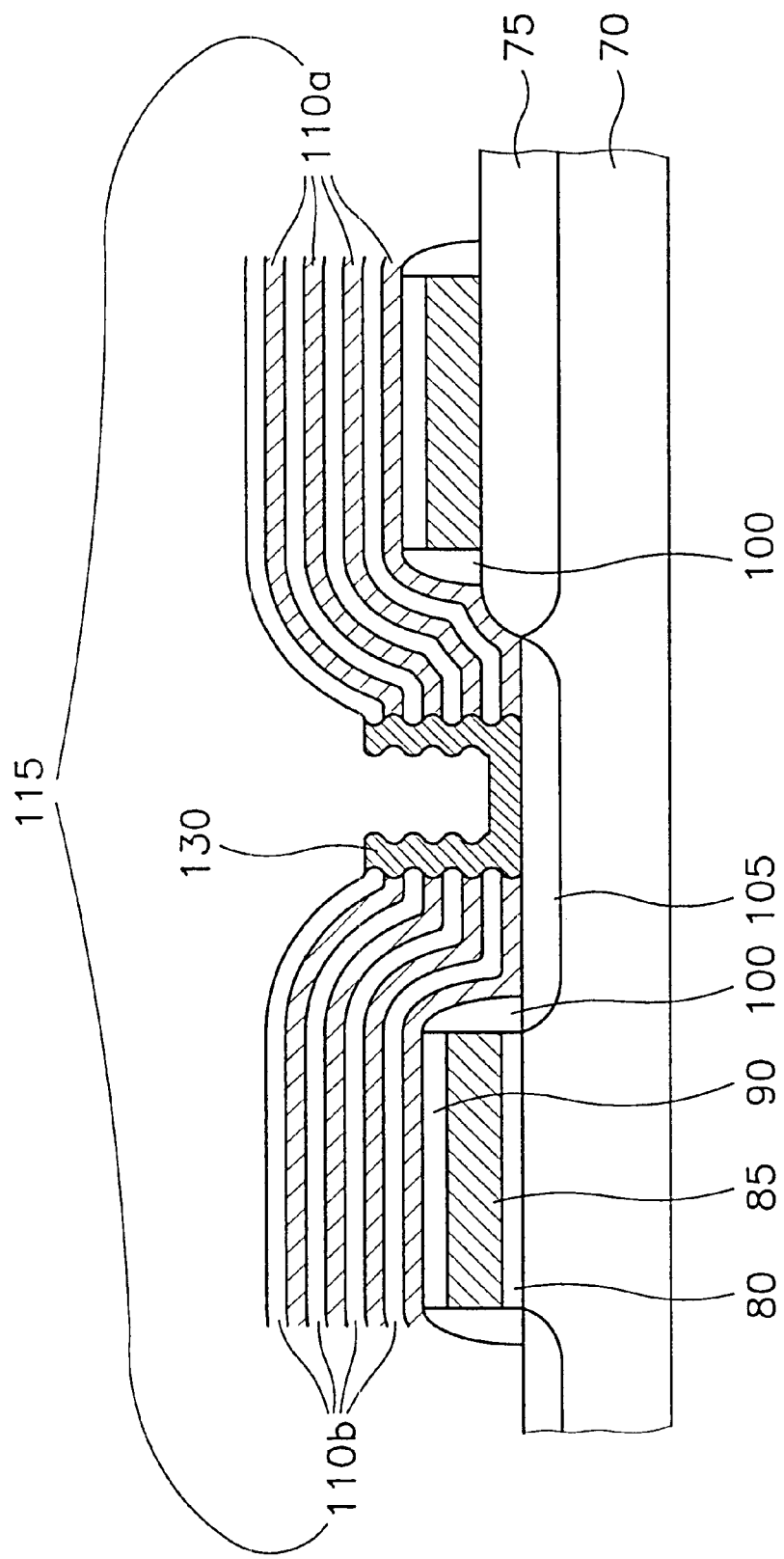

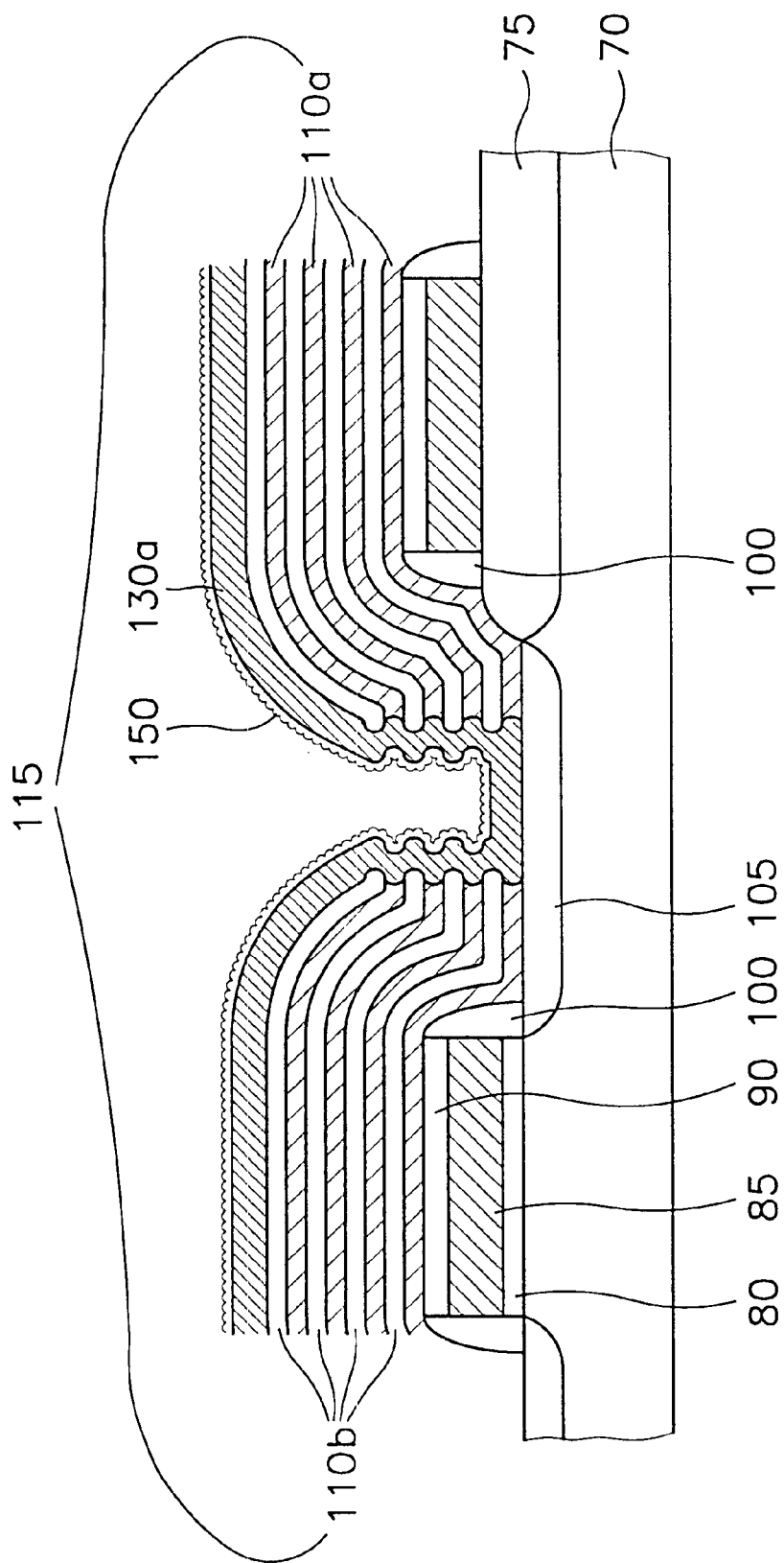

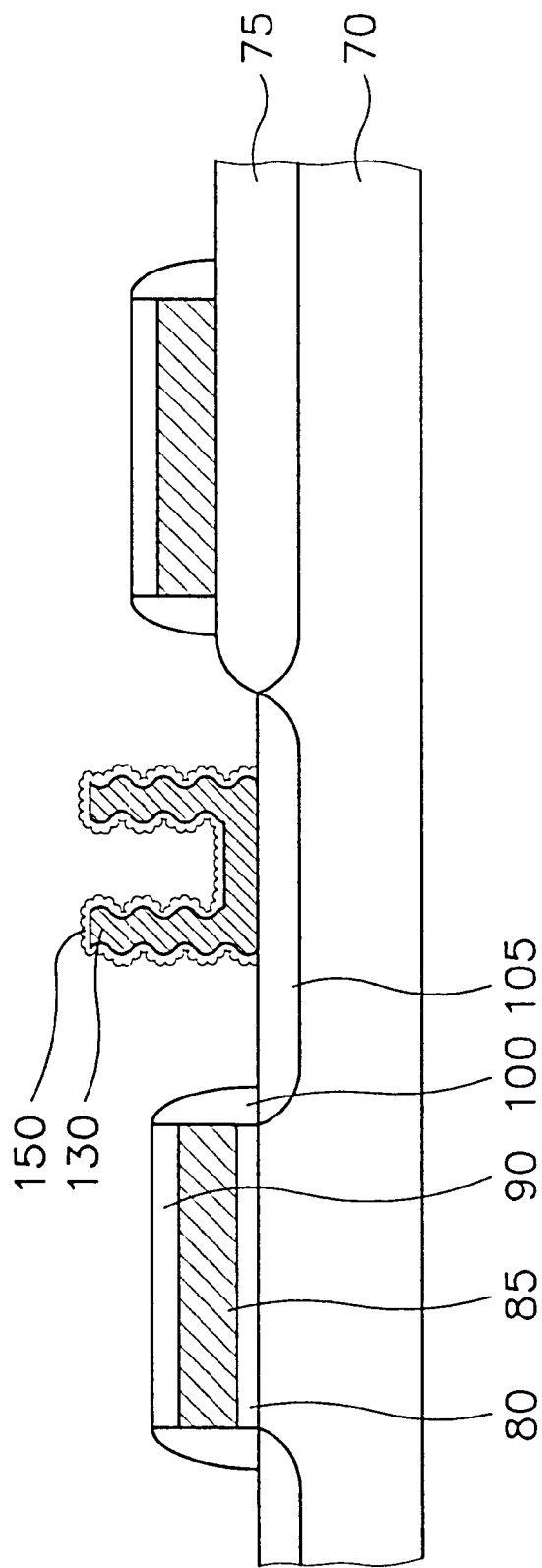

METHOD OF MANUFACTURING A CAPACITOR HAVING OXIDE LAYERS WITH DIFFERENT IMPURITIES AND METHOD OF FABRICATING A SEMICONDUCTOR DEVICE COMPRISING THE SAME

BACKGROUND OF THE INVENTION

1. Field of the Invention

The present invention relates to a method of manufacturing a capacitor and to a method of fabricating semiconductor devices comprising the same. More particularly, the present invention relates to a method of manufacturing a capacitor having a high storage capacitance and to a method of fabricating a semiconductor device comprising the same.

2. Description of the Prior Art

Recently, due to a rapidly increasing and widespread usage of computers, the need for semiconductor devices is expanding. Semiconductor devices having a high storage capacitance and a faster operating speed are now in great demand. To this end, current technology is focused on developing and realizing memory devices having a high degree of integration, response speed, and reliability.

Currently, a dynamic random access memory (DRAM) device which has a high memory capacity and random open input/output functions is widely used as a semiconductor memory device. DRAM devices generally comprise a memory cell region, at which information data is stored in the form of electric charge, and a peripheral circuit for the input/output of data to and from the memory cell region. Furthermore, DRAM devices conventionally include at least one access transistor and a storage capacitor.

Such a storage capacitor must be made smaller and smaller to meet the demand for memory devices having an increasingly higher degree of integration. Accordingly, manufacturing a capacitor having a higher storage capacitance and reduced size is increasingly becoming a challenge. In fact, producing a capacitor having a markedly increased storage capacitance within the same amount of area occupied on a substrate surface by any current storage capacitor is an ever prevailing task.

Generally, capacitance C is represented by the following mathematical expression.

$$C = \epsilon_0 \epsilon A/d$$

In the above expression, $\epsilon_0$ and $\epsilon$ respectively represent the dielectric constant in a vacuum and a dielectric constant of a dielectric film of a capacitor, while A represents the effective area and d represents the thickness of a dielectric film.

Referring to the above mathematical expression, storage capacitance can be increased by forming the dielectric film from a material having a higher dielectric constant, increasing the effective area of the capacitor, or by decreasing the thickness of the dielectric film.

However, the thickness of a dielectric film can be minimized only to a certain extent in highly integrated memory devices. Furthermore, although a number of dielectric materials having a high dielectric constant and processes of forming a dielectric film utilizing these materials are widely known in the art, processes of forming dielectric films of a material other than a nitride are difficult to incorporate into a mass production method of manufacturing semiconductor devices.

In view of the above, i.e., with respect to the method of manufacturing semiconductor devices, it is easiest to maximize the storage capacitance of a capacitor by maximizing its effective area. For instance, U.S. Pat. No. 5,185,282 discloses a stacked capacitor having the shape of a cup or cylinder, while U.S. Pat. No. 5,656,536 discloses a crown-shaped stacked capacitor, and U.S. Pat. Nos. 5,716,884 and 5,807,782 disclose fin-shaped stacked capacitors.

On the other hand, U.S. Pat. No. 5,877,052 discloses a method of increasing the storage capacitance by forming silicon hemispherical grains (HSG) on a storage electrode. Further, U.S. Pat. No. 5,913,119 discloses a method of forming an HSG layer on a cylindrical storage electrode by combining the above-mentioned techniques.

FIGS. 1A to 1D are sectional views illustrating a method of fabricating a capacitor having a cylindrical storage electrode formed with a silicon HSG layer according to U.S. Pat. No. 5,913,119.

As shown in FIG. 1A, a field oxide layer 3 is formed on a semiconductor substrate 1 for isolating various devices on the substrate 1. A gate oxide layer 5 is formed by thermal oxidation of the active region defined by the field oxide layer 3. Then, a poly-silicon layer 7 and subsequently a silicon oxide layer 9 are formed on the gate oxide layer 5. These layers are then patterned by a photolithography process to thereby yield a gate electrode 11.

Next, an oxide layer is deposited on the surface of substrate 1 adjacent gate electrode 11, and spacers 13 are produced on the side walls of the gate electrode 11 by etching the oxide layer. This process is followed by an ion doping process to form a transistor source/drain region 15.

An insulating interlayer 17 and then a silicon nitride layer 19 are then formed over the substrate 1. Selected portions of the insulating interlayer 17 and silicon nitride layer 19 are then etched to produce a contact hole which exposes the source/drain region 15.

A polysilicon layer is deposited on the silicon nitride layer 19 so as to fill the contact hole. A polysilicon contact 21 is then formed in the contact hole by performing an etch back process.

Next, a cylindrical storage electrode is produced. First, a silicon oxide layer is deposited on the silicon nitride layer 19 and contact 21. Then, utilizing a photolithography process in which a photoresist pattern 27 serves as a mask, the silicon oxide layer is etched to form a silicon oxide layer pattern 23.

As shown in FIG. 1B, after the photoresist pattern 27 is removed, amorphous silicon layers 29, 31, 33, and 35 each having different doped levels of impurities are sequentially formed on silicon nitride layer 19, contact 21, and silicon oxide layer pattern 23. The upper portions of amorphous silicon layers 29, 31, 33, and 35 are then polished by a chemical mechanical polishing (CMP) process. The silicon oxide layer pattern 23 is etched away to yield a cylindrical storage electrode 36.

Referring to FIG. 1C, silicon HSG seeds are deposited on the cylindrical storage electrode 36. Then the seeded storage electrode is subjected to a number of heat treatment processes to grow the seeds and convert amorphous silicon layers 29, 31, and 33 into a silicon HSG layer 37 on the surface of the storage electrode 36.

Referring to FIG. 1D, a dielectric film 39 having an ONO (oxidized-silicon nitride-silicon oxide) structure is formed on the silicon HSG layer 37. Thereafter, a polysilicon plate electrode 41 is formed on the dielectric film 39. An etching process shapes the resultant structure to produce a capacitor 43 comprising storage electrode 36, dielectric film 39, and plate electrode 41.

However, because the above-described process of manufacturing a capacitor attempts to increase the effective area by varying the cylindrical or crown-shaped structural configuration of the capacitor, rather than increasing the surface area of the storage electrode itself, the process faces a fundamental limitation in increasing the storage capacitance. Furthermore, a significant increase in capacitance can hardly be expected compared to the many other variations of cylindrical capacitors known in the art.

Nonetheless some increase in the effective area of the capacitor can be expected by forming a silicon HSG layer on the surface of the storage electrode according to the disclosed method. However, the method is complex, involving the depositing of a number of amorphous silicon layers and a number of heat treatment processes. Accordingly, the prior art method is disadvantageous in that it has low reproducibility and hence, it is associated with high manufacturing costs.

In view of these problems, other methods of forming a storage electrode of a high capacitance capacitor have been developed. One of these methods is as disclosed in U.S. Pat. No. 5,843,822. This patent discloses the use of thermal chemical vapor deposition (thermal CVD) and plasma enhanced chemical vapor deposition (PECVD) to form oxide layers exhibiting a different etching rate from each other when etched by hydrofluoric acid (HF) etchant. Etching the oxide layers at different etching rates produces a wrinkled storage electrode.

FIG. 2 helps illustrate the process of manufacturing a cylindrical capacitor having a wrinkled storage electrode as disclosed in U.S. Pat. No. 5,843,822.

Referring to FIG. 2, a substrate 1 is provided with a source region 53. A first insulating layer 55 of boro-phospho silicate glass (BPSG) is then formed on the substrate 1. Then, the upper portion of the first insulating layer 55 is planarized by utilizing a CMP process.

A second insulating layer 57 of a silicon oxide is then deposited on the planarized first insulating layer 55. Both the first and second insulating layers 55 and 57 are etched to form a contact hole which exposes the source region 53.

A first polysilicon layer 59 is formed on the top portion of the second insulating layer 57 to fill the contact hole. Then, a number of first oxide layers 61 and a number of second oxide layers 63 are alternately formed on the first polysilicon layer 59 by thermal CVD and PECVD methods, respectively. More specifically, first oxide layers 61 each having a thickness of about 200–400 Å are formed by thermal CVD at a temperature of 750–900° C. The second oxide layers 63 each also having a thickness of about 200–400 Å are formed by PECVD at a temperature of 300–400° C.

Portions of the first and second oxide layers 61 and 63 are anistropically etched to form two trenches 67 which extend parallel to each other and expose the first polysilicon layer 59. Then, the exposed side walls of the first and second oxide layers 61 and 63, defining the trenches 67, are subjected to a wet-etching process utilizing hydrofluoric acid HF as the etchant. Due to the different etching rates of the first and second oxide layers 61 and 63, the side walls are etched unevenly and a side wall having a wrinkled or corrugated profile is produced.

A second polysilicon layer is then formed on the side wall and on top of the exposed first polysilicon layer 59. A storage electrode having a wrinkled side wall is produced by then removing the first and second oxide layers 61 and 63.

In the above-described method of manufacturing a capacitor having a wrinkled storage electrode, the effective area of the storage electrode itself is increased. However, because the thermal CVD process is carried out at a temperature of 750–900° C. to form the first oxide layers, there is a risk of thermally damaging the transistor and various other components in the active and peripheral circuit regions of the substrate.

In fact, it is well known in the art that using any thermal process in excess of 600° C. in manufacturing a semiconductor device imparts thermal damage to the substrate of the device as well as to a myriad of components present on the substrate at the time of the thermal treatment. Thus, it is highly probable that the above-described method, which includes a process carried out at a temperature of about 900° C., will produce semiconductor devices exhibiting thermal damage. In fact, in the above described process, thermal damage to the substrate and the various components of the device is inevitable because the thermal CVD process which is required to be carried out at a high temperature is repeated a number of times until a desired height or thickness of oxide layers is achieved.

SUMMARY OF THE INVENTION

In view of the above, it is an object of the present invention to provide a method of manufacturing a capacitor having a storage electrode provided with a large surface area which creates a correspondingly high storage capacitance, and which method does not require processes which are carried out at high temperatures.

In order to achieve this object, the method of manufacturing a capacitor of the present invention forms a wrinkled storage electrode using processes which are carried out at no more than about 600° C. First, a sacrificial structure is formed on a substrate. The sacrificial structure comprises a number of oxide layers each formed by low pressure CVD or plasma enhanced CVD carried out at about 400–600° C. Adjacent ones of the oxide layers exhibit different etching rates when exposed to a predetermined etchant. The different etching rates can be the result of differences in the boron or phosphorous content of the layers or of differences in type or concentration of impurities. At least one hole is formed in the sacrificial structure, whereby a side wall delimiting the hole is produced. The side wall is etched by the etchant, whereby a series of tooth-like prominences and depressions are formed at the side wall. Then, a conductive material is deposited on the side wall to form a storage electrode in which the prominences and depressions of the side wall of the sacrificial structure are reproduced. The sacrificial structure is thereafter removed, whereby the conductive material left remaining constitutes the storage electrode of the capacitor.

A second object of the present invention to provide a method of manufacturing a semiconductor device comprising a capacitor having a high capacitance created by the surface area of the storage electrode of the capacitor, and which method does not require processes which are carried out at high temperatures.

In order to achieve the second object of the present invention, a capacitor including a storage electrode having a side wall formed with a series of prominences and depressions is produced from a sacrificial structure of oxide layers formed at temperatures no higher than 600° C.

The capacitor is formed on a substrate having a transistor including a source/drain region. First, an insulating layer is formed over the transistor. A hole is then formed through the insulating layer so as to expose the source/drain region. A first layer of conductive material is then deposited over the substrate to fill the hole. The layer is then planarized so that the insulating layer is exposed and a contact plug is left in the hole. Next, a sacrificial structure comprising a number of oxide layers is formed on the insulating layer including over the contact plug. The oxide layers are each formed by low pressure CVD or plasma enhanced CVD carried out at about 400–600° C. Adjacent ones of the oxide layers exhibit different etching rates when exposed to a predetermined etchant. The different etching rates can be the result of differences in the boron or phosphorous content of the layers or of differences in type or concentration of impurities. At least one hole is formed through the sacrificial structure to expose the contact plug, whereby a side wall delimiting the hole is produced. The side wall is etched by the etchant, whereby a series of tooth-like prominences and depressions are formed at the side wall. Then, a conductive material is deposited on the side wall and over the contact plug to form a storage electrode in which the prominences and depressions of the side wall of the sacrificial structure are reproduced. The sacrificial structure is thereafter removed, whereby the conductive material left remaining constitutes the storage electrode of the capacitor. A dielectric material and another layer of conductive material are formed over the storage electrode to complete the capacitor.

In accordance with the present invention, the oxide layers of the sacrificial structure may be formed in a single reaction chamber of a CVD apparatus by varying the gas containing agents of an impurity in successive cycles of operation. Alternatively, the oxide layers may be respectively formed in discrete chambers of a CVD apparatus. Still further, the oxide layers having different types or concentrations of impurities may be respectively formed at different injectors of a gas injection system.

Also, according to the present invention, a silicon HSG layer can be formed on the surface of the storage electrode having the tooth-like prominences and depressions, for further increasing the capacitance of the resultant capacitor. In this method, a protective layer of oxide material is formed over the storage electrode to protect the silicon HSG layer during the process of removing the sacrificial structure.

Each of the oxide layers of the sacrificial structure is formed to a thickness of about 100–1000 Å. Disregarding the time factor involved in the process of manufacturing the sacrificial structure, each of the oxide layers preferably has a thickness of 200 Å. The thinner the oxide layers, the finer the series of prominences and depressions which can be formed at the side wall of the sacrificial structure. In turn, the finer the series of prominences and depressions at the side wall of the sacrificial structure, the finer the series of prominences and depressions at the side wall of the storage electrode and hence, the higher the storage capacitance of the capacitor.

Finally, a silicon HSG layer can be formed on the fine series of prominences and depressions at the side wall of the storage electrode to even further enhance the capacitance level of the capacitor.

BRIEF DESCRIPTION OF THE DRAWINGS

The above and other objects, features and advantages of the present invention will become more apparent from the following detailed description of the preferred embodiments thereof made with reference to the attached drawings, of which:

FIGS. 3A to 3F are sectional views of a semiconductor wafer illustrating a first embodiment of a process of manufacturing a semiconductor device having a storage capacitor according to the present invention;

FIGS. 4A to 4D are sectional views of a semiconductor wafer illustrating a process of forming a silicon HSG layer on the surface of a storage electrode of the first embodiment of the present invention having a side wall shaped by a teeth-like prominences and depressions;

DETAILED DESCRIPTION OF THE PREFERRED EMBODIMENTS

Hereinafter, the preferred embodiments of the present invention will be described in detail below, with reference to the accompanying drawings.

Embodiment 1

FIGS. 3A to 3F illustrate the first embodiment of a process of manufacturing a storage capacitor and a semiconductor device comprising the same according to the present invention.

Figure 1A:
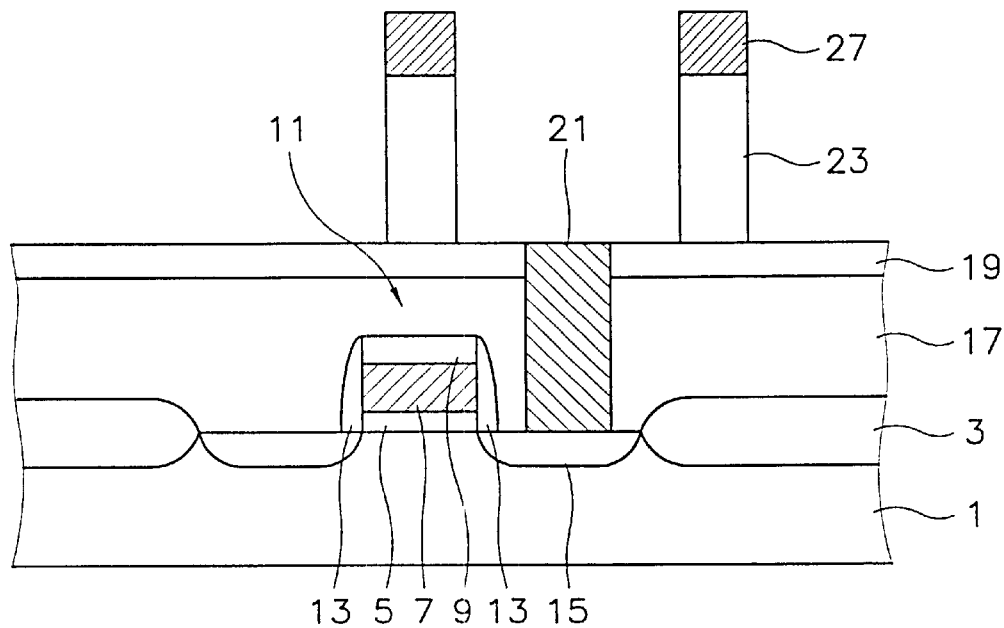
FIGS. 1A to 1D are sectional views of a semiconductor wafer illustrating the steps in the manufacturing of a conventional capacitor.
Figure 1B:
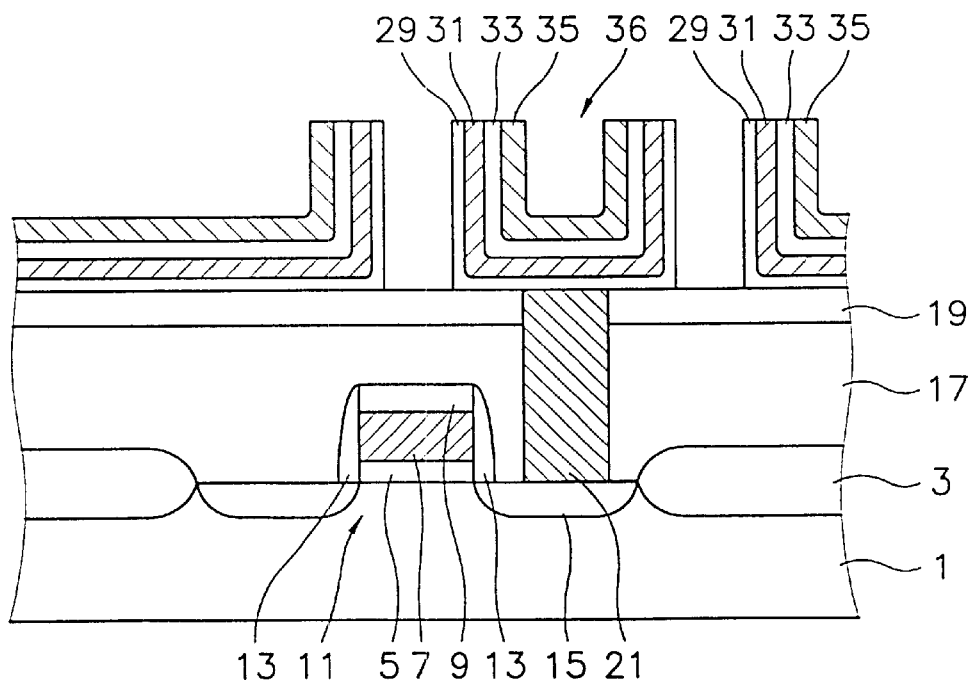
Figure 1C:
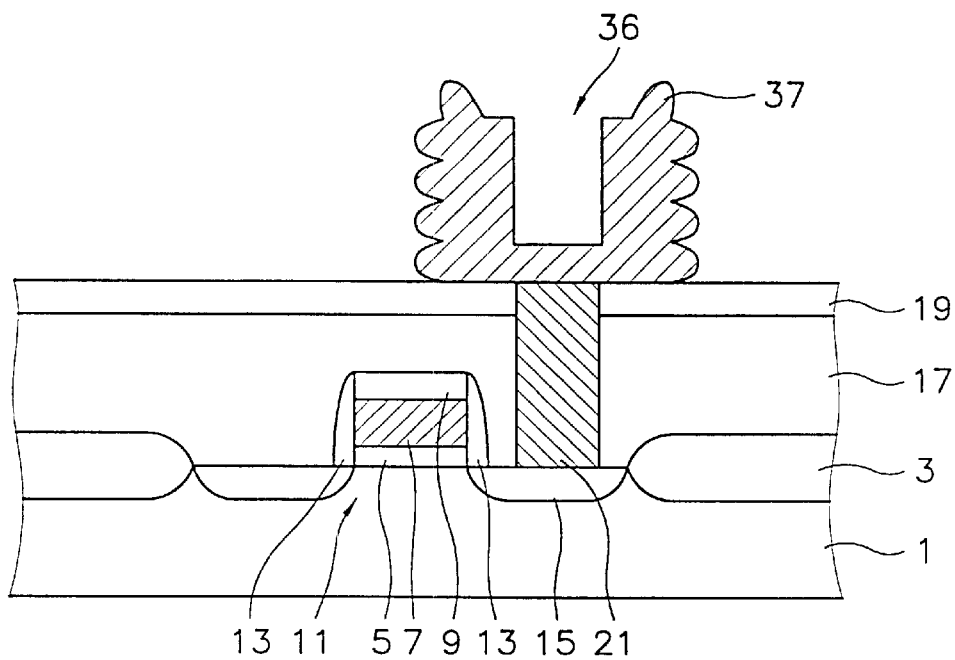
Figure 1D:
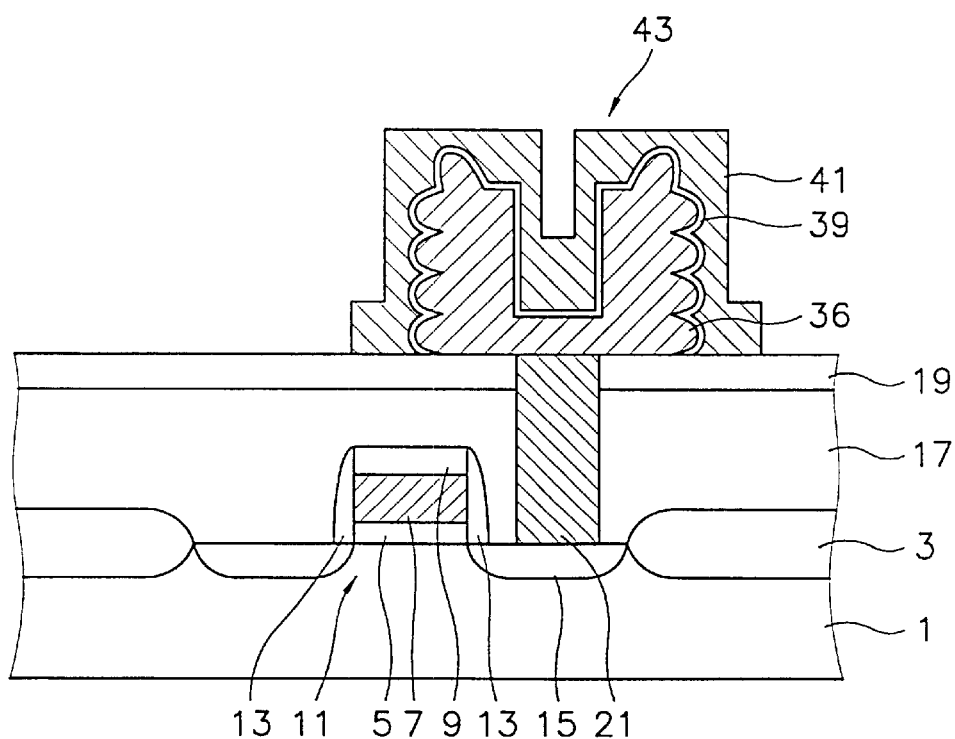
Figure 2:
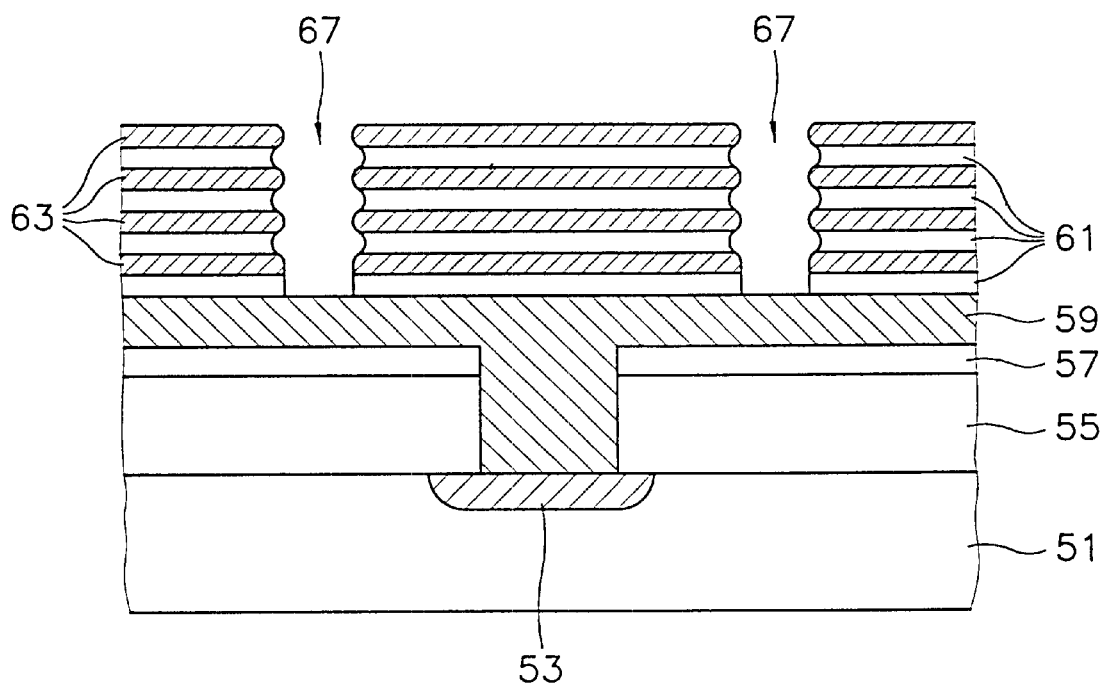
FIG. 2 is a sectional view of a semiconductor wafer illustrating another conventional process of manufacturing a cylindrical capacitor.
Figure 3A:
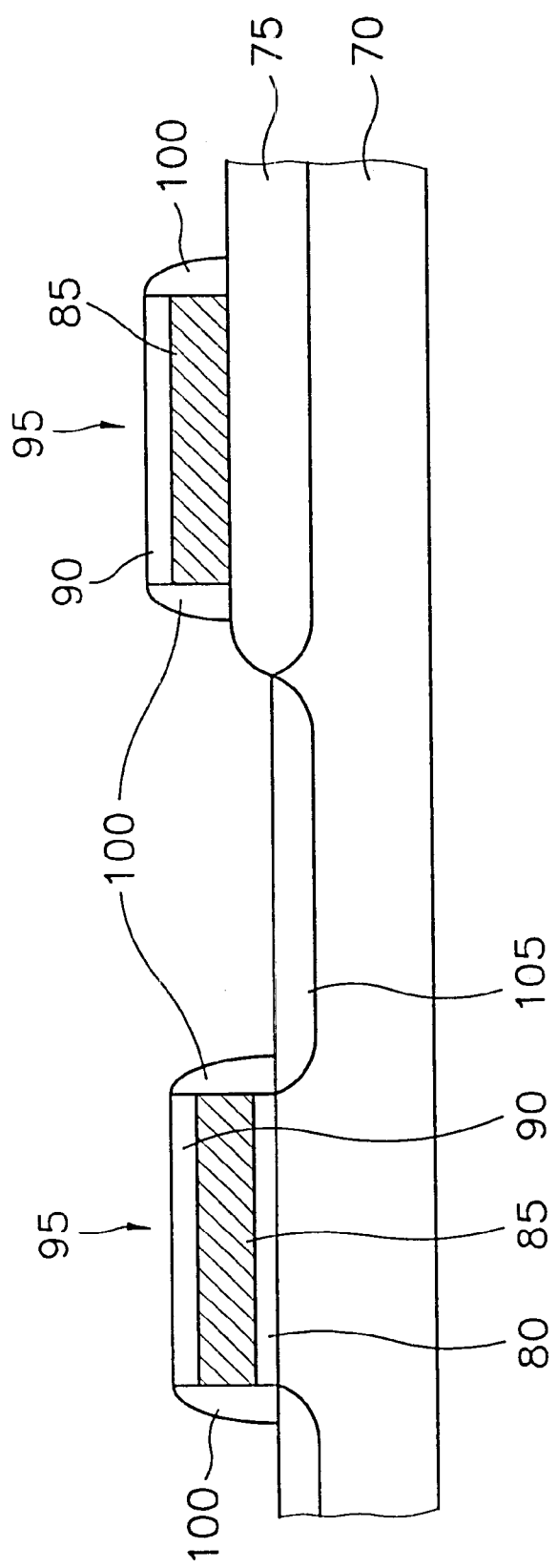

As shown in FIG. 3A, a field oxide layer 75 is formed on a semiconductor substrate 70 by local oxidation of silicon (LOCOS) for defining the active regions of various devices on the substrate 70. Next, a thin gate oxide layer 80 is formed by thermal oxidation on the active region defined by the field oxide layer 75. The field oxide layer 75 has a thickness of about 2000–6000 Å, while the gate oxide layer 80 has a thickness of about 40–200 Å.

A first polysilicon layer and subsequently a first insulating layer of a silicon oxide are deposited on the field oxide layer 75 and gate oxide layer 80. The first polysilicon layer has a thickness of about 500–4000 Å, and is produced by low pressure chemical deposition (LPCVD). On the other hand, the first insulating layer has a thickness of about 500–2000 Å, and is produced by low pressure chemical vapor deposition or plasma enhanced chemical vapor deposition method (PECVD). Then, a respective gate electrode 95 having a polysilicon pattern 85 and an insulating layer pattern 90 is formed on the field oxide layer 75 and on the gate oxide layer 80 by etching the first polysilicon layer and the first insulating layer.

Then, a second insulating layer having a thickness of 1000–4000 Å is formed from an HTO (high temperature oxide) material on the gate electrodes 95 by low pressure chemical vapor deposition or plasma enhanced chemical vapor deposition. Subsequently, a spacer 100 is formed on the side wall of each respective gate electrode 95 by etching the second insulating layer using an anisotropic etching process.

Thereafter, utilizing the gate electrode 95 as a mask, impurities are ion-implanted into the active region to form a source/drain region 105. Here, instead of a CMOS, which is conventionally used in the memory devices as an access transistor, various other access transistors including a FET and a MOSFET can be used in the present invention.

Figure 3B:
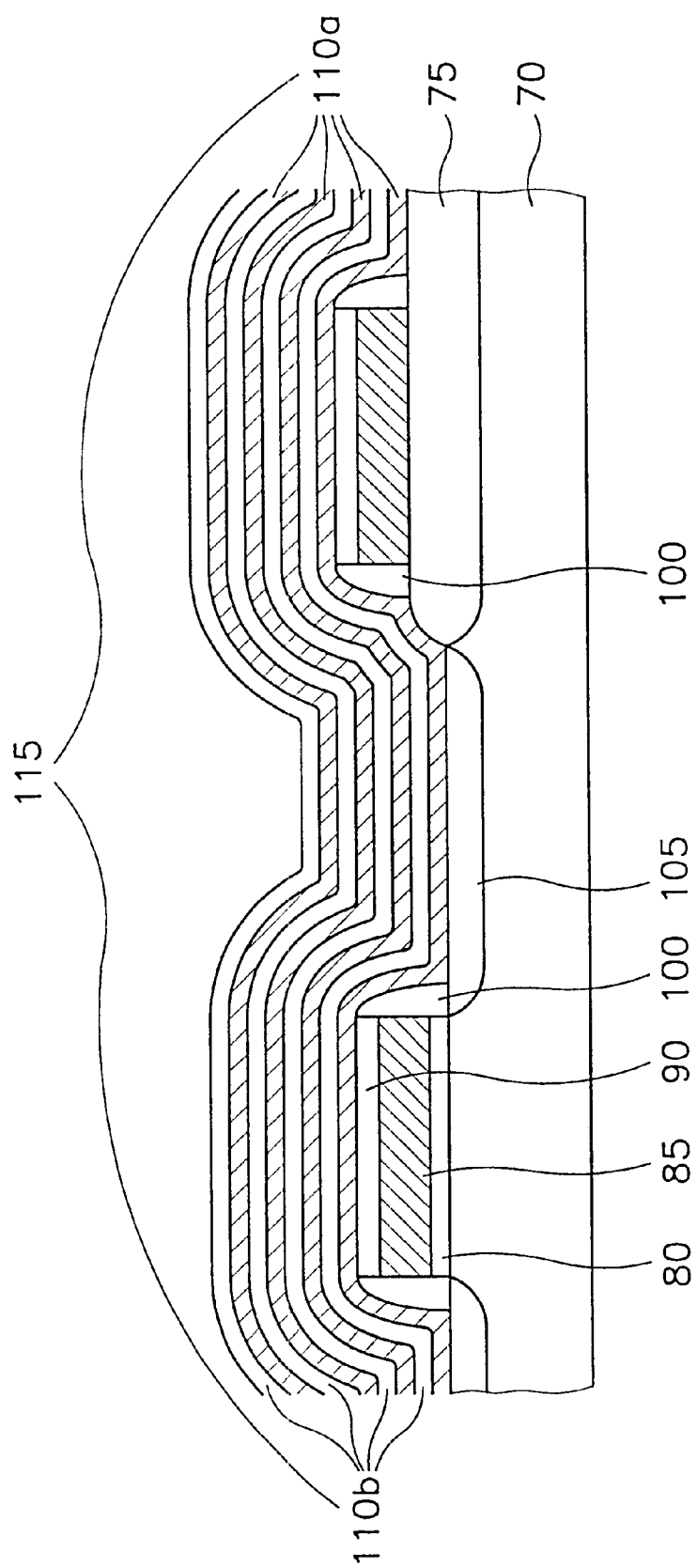

Referring to FIG. 3B, a multi-layered sacrificial structure 115 is formed over the transistor, i.e., over the entire surface of the substrate 70. The multi-layered sacrificial structure 115 comprises a number of oxide layers 110a and 110b stacked one upon the other. Adjacent ones of the oxide layers 110a and 110b exhibit different etching rates.

The oxide layers of the multi-layered sacrificial structure 115 can be made from BPSG, PSG, USG, and the like exhibiting different etching rates in an etchant having an HF composition. However, it is to be understood that the sacrificial structure 115 can be made from oxide or nitride materials having impurities which exhibit different etching rates with respect to various other types of etchants, as are known in the art. Furthermore, although the sacrificial structure 115 has been described as being formed from only two types of (oxide) layers according to the present invention, the sacrificial structure can, of course, be formed of three or more different types of (oxide) layers.

Next, the steps of forming the multi-layered sacrificial structure 115 will be described. For a first method, an apparatus (not shown) having at least two reaction chambers is used. The substrate is transferred between the chambers (not shown), wherein first and second oxide layers 110a and 110b (BPSG layers) having different weight percents of boron and phosphorus are alternately deposited on the transistor formed on substrate 70.

More specifically, the first oxide layer 110a is formed in the first chamber by a low pressure chemical vapor deposition method or plasma enhanced chemical vapor deposition at a temperature of about 400–600° C. Tetraethylorthosilicate (TEOS) is used as the reaction gas, and 5 weight % each of boron and phosphorus are added to the chamber with the reaction gas. As a result, a BPSG having a boron:phosphorus weight ratio of about 1:1 is deposited on the transistor in the first chamber. The first BPSG layer, formed by in situ doping as described above, has a thickness of 100–1000 Å, and preferably of about 800 Å.

Afterwards, the substrate 70 is transferred to a second chamber to similarly form the second oxide layer 110a by low pressure chemical vapor deposition or plasma enhanced chemical vapor deposition at a temperature of about 400–600° C. In this case, 6–8 weight % and 4–5 weight % each of boron and phosphorus are added to the TEOS reaction gas in the second chamber in order to form a second BPSG layer having a boron:phosphorus weight ratio of about 1.2–2:01. The second BPSG layer preferably has a boron:phosphorus weight ratio of about 1.5:1 and has a thickness of 100–1000 Å, preferably of about 800 Å.

In addition, the first and second oxide layers 110a and 110b (BPSG layers) can be subjected to a thermal treatment at 600–800° C. to produce a smooth surface.

Alternatively, the first and second oxide layer 110a and 110b can be PSG layers having different weight percents of phosphorus are formed by low pressure chemical vapor deposition or plasma enhanced chemical vapor deposition. In this case, 7–9 weight % of phosphorus is added to TEOS reaction gas in the first chamber, to deposit PSG as the first oxide layer 110a over the transistor on the substrate 70. Then, 3–5 weight % of phosphorus is added to TEOS reaction gas in the second chamber, to deposit PSG as the second oxide layer 110b on the first oxide layer 110a.

The above-described steps are repeated to produce the sacrificial structure 115 comprising alternating first and second PSG layers having different amounts of phosphorus. Preferably, the first and second oxide (PSG) layers 110a and 110b each have a phosphorus weight ratio of 1.4–3.0:1 and a thickness of about 100–1000 Å.

Still further, the first and second oxide layers 110a and 110b having different etching rates in an etchant having HF composition can alternatively comprise alternating layers of BPSG and PSG, alternating layers of BPSG and USG, or alternating layers of PSG and USG. Such layers can be formed in respective reaction chambers without having to add different amounts of boron or different amounts of phosphorous to a reaction gas introduced into each of the chambers.

Capacitors utilized in 64 MB and faster memory devices currently have a thickness of 10,000 Å. Accordingly, a storage electrode of a capacitor having a similar thickness of 9600 Å can be produced, when each of the first and second oxide layers 110a and 110b has a thickness of 800 Å, by repeating the above-described process six times. Moreover, a capacitor having a thickness of 10000 Å or greater can be produced by increasing the thicknesses of the first and second oxide layer 110a and 110b and/or by repeating the process seven or more times. Increasing the thicknesses of the oxide layers also reduces the time required to build a sacrificial structure to the desired thickness. The processing time can also be reduced by utilizing three or more distinct reaction chambers.

The sacrificial structure 115 can also be formed in a single reaction chamber. The process of forming the sacrificial structure 115 in a single chamber is very similar to the processes described above occurring in multiple chambers. That is, a series of first and second oxide layers 110a and 110b are formed in the chamber by low pressure chemical vapor deposition or plasma enhanced chemical vapor deposition at a temperature of about 400–600° C.

More specifically, 5 weight % each of boron and phosphorus are added to TEOS reaction gas in a reaction chamber in order to produce a first BPSG layer having a boron:phosphorus weight ratio of about 1:1 on the transistor formed on substrate 70. The first BPSG layer constituting the first oxide layer 110a, has a thickness of 100–1000 Å.

Next, 6–8 weight % and 4–5 weight % each of boron and phosphorus are introduced into the same chamber containing the TEOS reaction gas to thereby produce a BPSG layer, i.e., a second oxide layer 110b, having a boron:phosphorus weight ratio of about 1.2–2.0:1 and a thickness of 100–1000 Å on the first oxide layer 110a.

Furthermore, the above-described process of forming a sacrificial structure 115 of first and second oxide layers 110a and 110b of BPSG in a single reaction chamber can be modified to instead form the oxide layers of BPSG and PSG, of BPSG and USG, or of PSG and USG, which exhibit different etching rates when etched by an etchant having an HF composition.

Moreover, although the time required to form a sacrificial structure 115 in a single chamber is longer compared to the previously disclosed method of forming the structure in a plurality of distinct chambers, the former process is advantageous in that the oxide layers have a higher degree of uniformity. The full advantage realized in this respect will be made clearer later on.

Now, however, a third method of forming the sacrificial layer 115 using an injector system having multiple injectors will be described.

According to this method, a substrate 70 is transferred to a first injector by a transportation apparatus (not shown) similar to a conveyor belt, TEOS is utilized as a reaction gas, and 5 weight % each of boron and phosphorus are added to the reaction gas by the first injector, whereby a first BPSG layer is deposited on the substrate 70. The first BPSG layer, i.e., the first oxide layer 110a, has a thickness of 100–1000 Å. Next, 6–8 weight % and 4–5 weight % each of boron and phosphorus are injected by the second injector along with the TEOS reaction gas. As a result, a second BPSG layer having a thickness of 100–1000 Å is formed and deposited, as the second oxide layer 110b, on the first oxide layer 110a. Similar to what was described earlier, the first BPSG layer has a boron:phosphorus weight ratio of about 1:1 and the second BPSG layer has a boron: phosphorus weight ratio of about 1.2–2.0:1.

The first and second oxide layers 110a and 110b can also be formed, using the steps described above, of BPSG and PSG layers, of BPSG and USG layers, or of PSG and USG layers.

If the injector system has four injectors, two series of the first and second oxide layers 110a and 110b can be formed during a single run through the system. Consequently, a sacrificial structure 115 having a thickness of 9600 Å can be formed in three runs. A sacrificial structure 115 having a thickness of 9600 Å can be produced even more quickly if the injector system has six injectors. The injector system is thus most advantageous in terms of saving time in the fabrication process and hence, in reducing manufacturing costs.

As described by the above, the sacrificial structure 115 of a plurality of oxide layers is formed by an in situ doping method. However, the oxides can be first deposited on the Mo substrate and then doped with impurities using an ion implantation process in forming the sacrificial structure 115. Specifically, after an oxide is deposited on the substrate 70, the oxide is ion-implanted with boron and/or phosphorous using $BF_3$ or $BCl_3$ gas as an agent for providing the boron, $PH_3$ or $PF_3$ gas as an agent for providing the phosphorus, and an ion implantation energy level of 30–50 KeV.

Referring now to FIG. 3C, the sacrificial layer 115 is coated with a film of a photoresist using the technique already described for this purpose. Then a photoresist pattern 120 is formed by photolithography. Next, utilizing the photoresist pattern 120 as a mask, the sacrificial layer 115 is etched to form a hole 125 exposing the source/drain region 105. Here, the hole 125 is formed by an anisotropic etching process, i.e., a conventional reactive ion etching method.

Referring to FIG. 3D, a side wall of the sacrificial structure 115 which defines the hole 125 is wet-etched for about 20 to 40 seconds by an etchant having an HF composition with an $HF:H_2O$ ratio of about 1:1 to about 2:1. Because the second oxide layer 110b has a higher phosphorus content than the first oxide layer 110a, the second oxide layer 110b is etched to a greater extent than the first oxide layer 110a.

Nonetheless, because both layers are made of the same oxide material, the difference in the etching rates is very slight, compared to the difference in etching rates when the layers are made, respectively, of oxide and nitride materials. As a result of this slight difference in the etching rates, tooth-like prominences and depressions are formed at the side wall of the sacrificial structure 115.

It should also be noted that the greater the degree of uniformity of the oxide layers 110a and 110b, the greater is the uniformity of the prominences and depressions. On the other hand, if the sacrificial structure 115 comprises three or more BPSG layers having different ratios of boron and phosphorus content or comprises three or more PSG layers having different phosphorus contents, prominences and depressions having a more irregular shape can be formed. In addition, the etching time can be increased to form more severe prominences and depressions. A storage electrode of the capacitor is to be formed on the side wall of the sacrificial structure 115 providing such prominences and depressions. Thus, the greater the severity of the prominences and depressions, the greater the surface area of the storage electrode becomes.

Currently in the art, in preparation for forming the storage electrode, the substrate is cleaned for about 30 seconds with an etchant having an HF composition. One of the important features of the present invention is that this conventional pre-cleaning process is implemented simultaneously with the forming of the prominences and depressions at the side wall of the sacrificial structure 115. That is, because the sacrificial structure 115 can be etched within the 30 second time period dedicated for the pre-cleaning process, the etching of the sacrificial structure 115 can be carried out simultaneously with the process of cleaning the substrate 70.

In the present embodiment, only one hole 125 is shown and described for the purposes of illustration. However, a number of holes are preferably formed. In this case, a number of side walls having prominences and depressions can be formed to render a capacitor having an increased effective area.

Referring to FIG. 3E, after the photoresist pattern 120 is removed, a second polysilicon layer is deposited on the side wall of the sacrificial structure 115 having prominences and depressions and on the source/drain region 105. Subsequently, an etch-back process is performed to produce a storage electrode 130.

The bottom of the storage electrode 130 contacts the source/drain region 105 and has inner and outer walls at which the patterns of the prominences and depressions of the sacrificial structure 115 are reproduced.

Figure 3F:
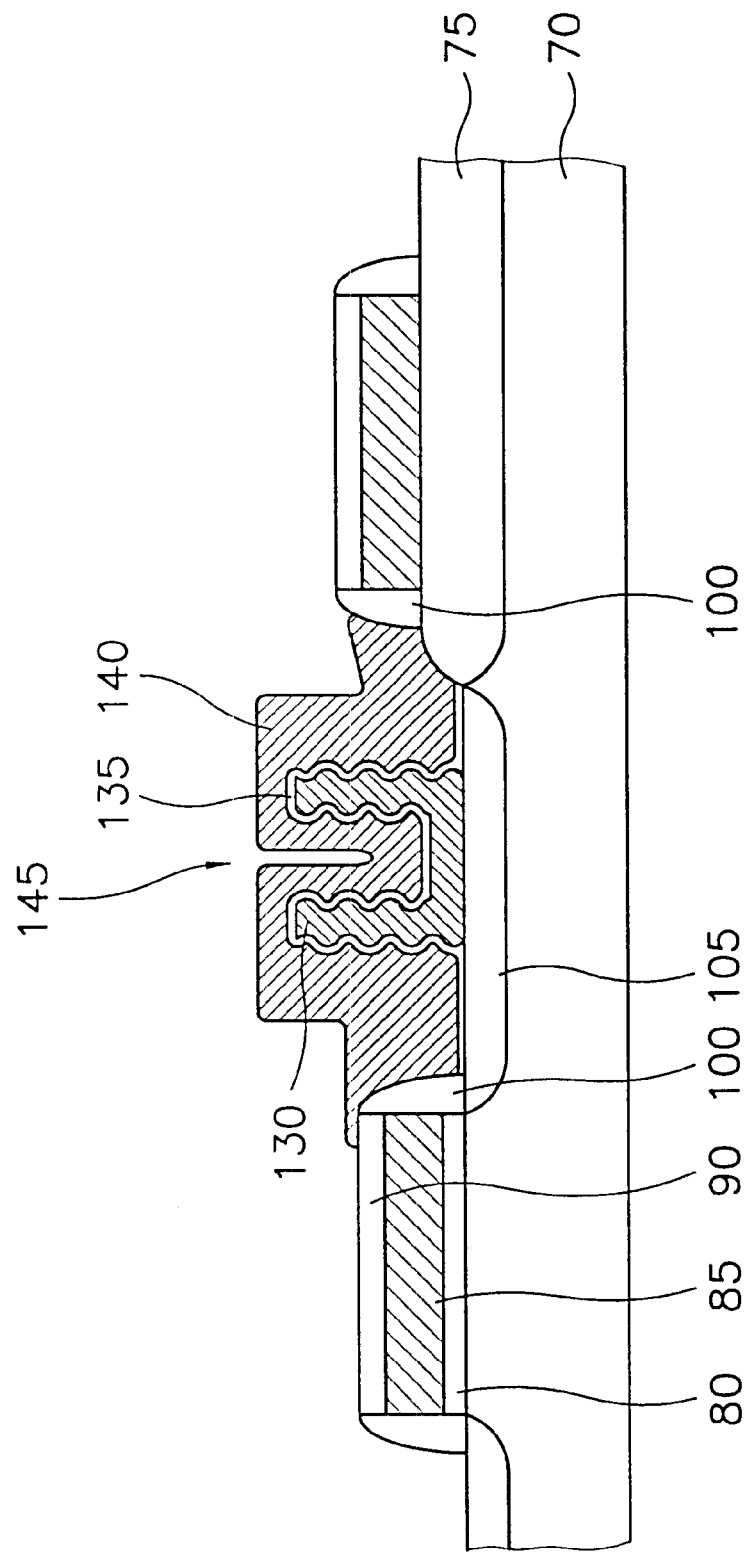

As shown in FIG. 3F, the sacrificial structure 115 is then removed using an etch-back process to reveal the storage electrode 130 and thus, completing the process of forming the storage electrode 130.

Thereafter, a layer of a dielectric material similar to a nitride layer and a third polysilicon layer are sequentially deposited on the surface of the storage electrode 130. Then, the layers are anisitropically etched. The result is a capacitor 145 having a storage electrode 130, dielectric film 135, and plate electrode 140.

FIGS. 4A to 4D illustrate a process of forming a silicon HSG layer on the surface of a storage electrode produced according to the first embodiment of the present invention. The HSGs further increase the storage capacitance of the capacitor.

Specifically, as shown in FIG. 4A, a silicon HSG layer 150 is formed on a polysilicon layer 130a which covers the sacrificial structure 115 and the source/drain region 105. The silicon HSG layer 150 covers the top of bottom, side, and top wall portions of the polysilicon layer 130a. The silicon HSG layer is formed utilizing $Si_2H_6$ as a reaction gas in a pressure reduced chemical vapor deposition chamber under a high vacuum or under a pressure less than $10^{-7}$ torr at about 400–600° C.

Figure 4B:
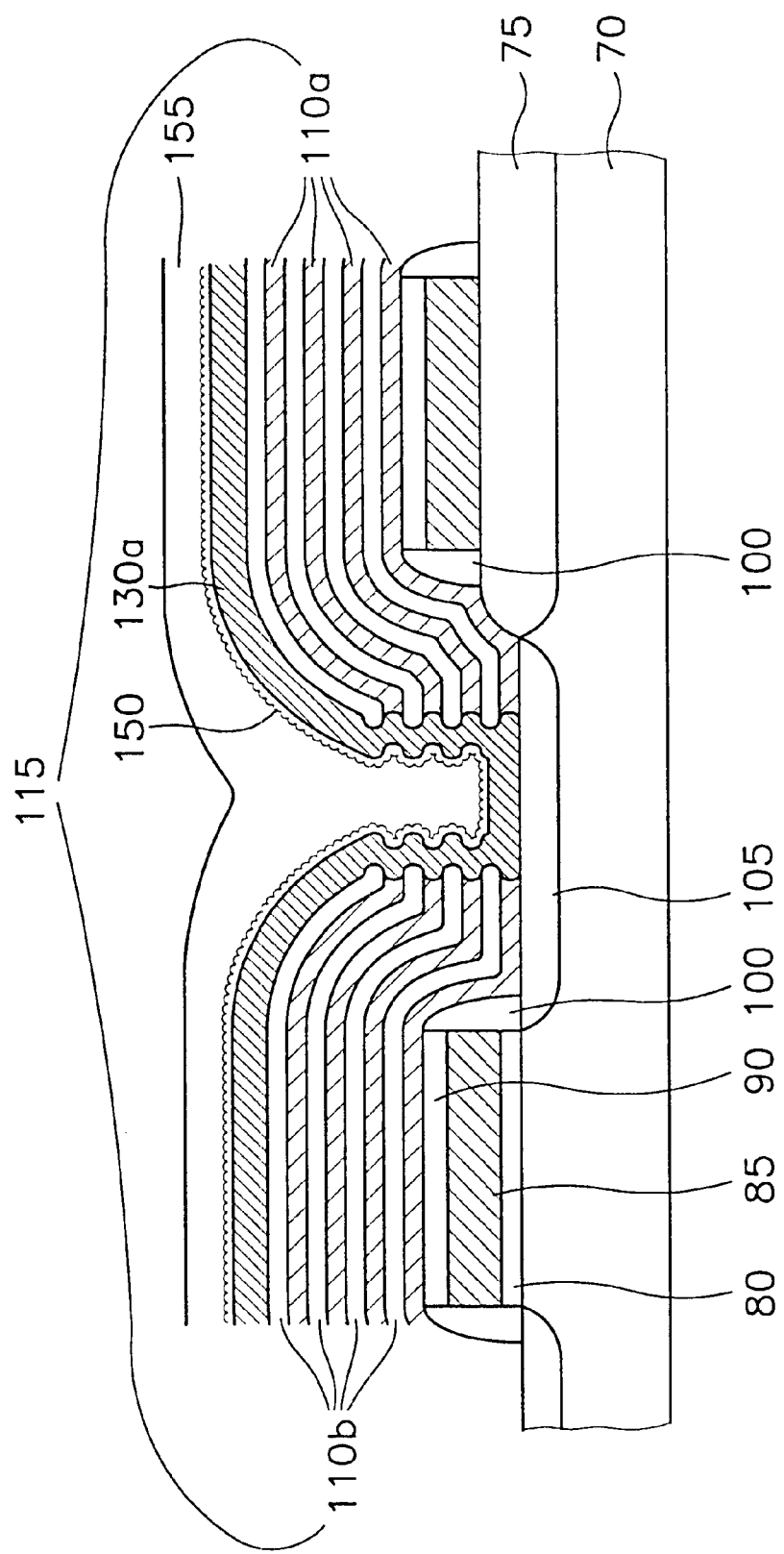

Referring to FIG. 4B, a protective layer 155 is formed by low pressure chemical vapor deposition on the silicon HSG layer 150. The protective layer 155 serves to protect the HSG layer 150 during the subsequent etching process in which the storage electrode is formed.

Figure 4C:
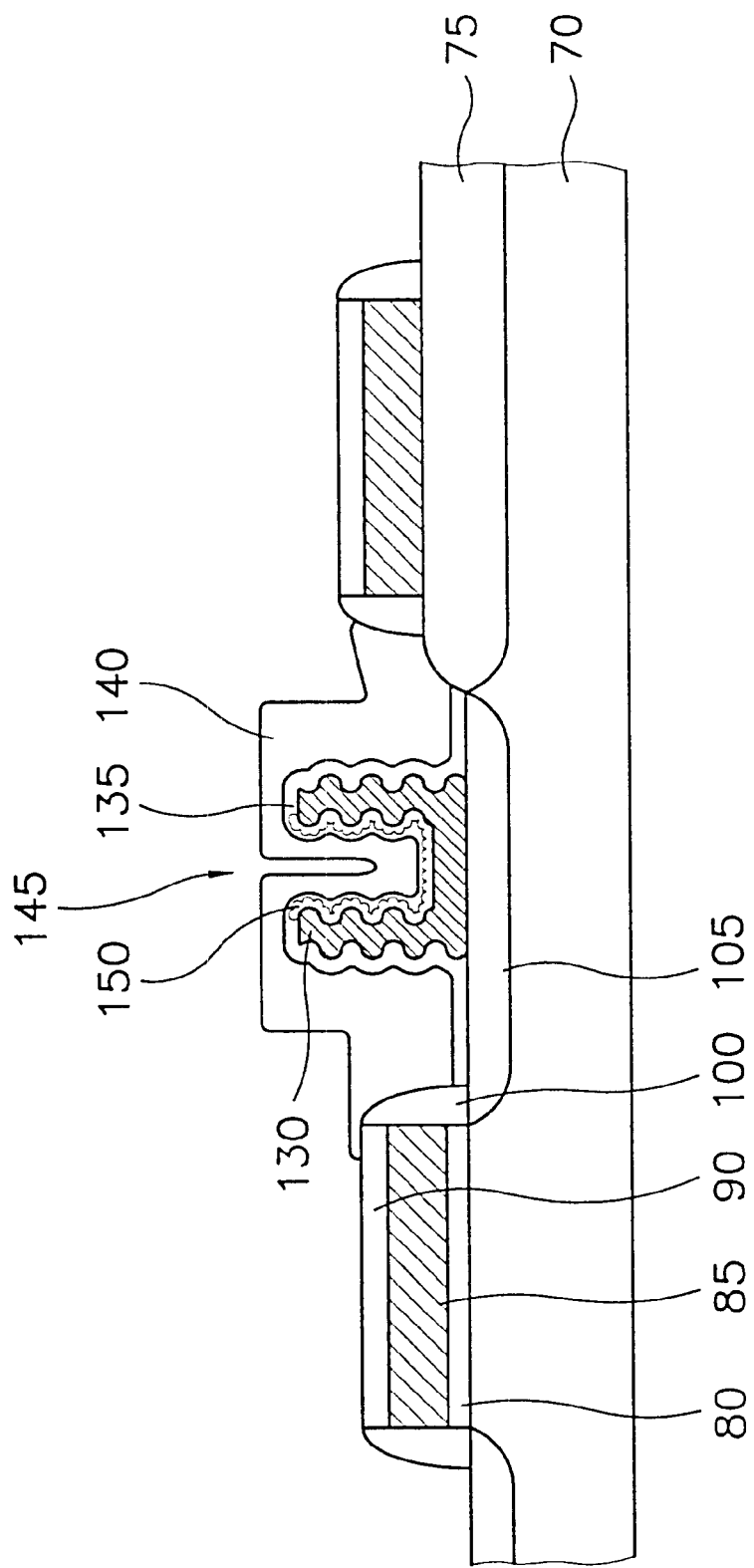

Referring next to FIG. 4C, the protective layer 155 and portions of the HSG layer not covering the side wall portion of the polysilicon layer 130a are subjected to an etch-back process. Then the sacrificial structure 115 and a portion of the polysilicon layer 130a are anisotropically etched to form a storage electrode 130 having a silicon HSG layer 150 covering its bottom and side wall portions.

Thereafter, a dielectric film 135 and a plate electrode 140 are sequentially formed on the storage electrode 130 to complete the capacitor 145.

As described above, the storage electrode 130 is produced by forming the silicon HSG layer 150 on the surface of the polysilicon layer 130a prior to its being etched. Alternatively, the etching of the polysilicon layer 130a may be performed prior to forming the HSG silicon layer.

FIG. 4D illustrates another storage electrode having a silicon HSG layer. As shown by this figure, the sacrificial structure 115 is completely removed by an anisotropic etching process to form the storage electrode 130. Then the storage electrode 130 is coated with the silicon HSG layer by the process described earlier. In this alternative method of forming the storage electrode 130, the entirety of the exposed surface of the storage electrode 130 is covered with the silicon HSG layer. Hence, a capacitor formed in this way has a greater storage capacitance than one in which the silicon HSG silicon layer is formed only on its exposed inner side wall surface.

Embodiment 2

FIGS. 5A to 5D illustrate a method of manufacturing a memory device having a capacitor according to the present invention. Throughout FIGS. 5A to 5D, elements which correspond to those shown in FIGS. 3A to 3E are designated by like reference numerals. Furthermore, the process of forming a transistor on the substrate will not be elaborated upon, since the process is the same as that already described in connection with Embodiment 1. Similarly, the process of forming a sacrificial structure is the same as that used in Embodiment 1.

Figure 5A:
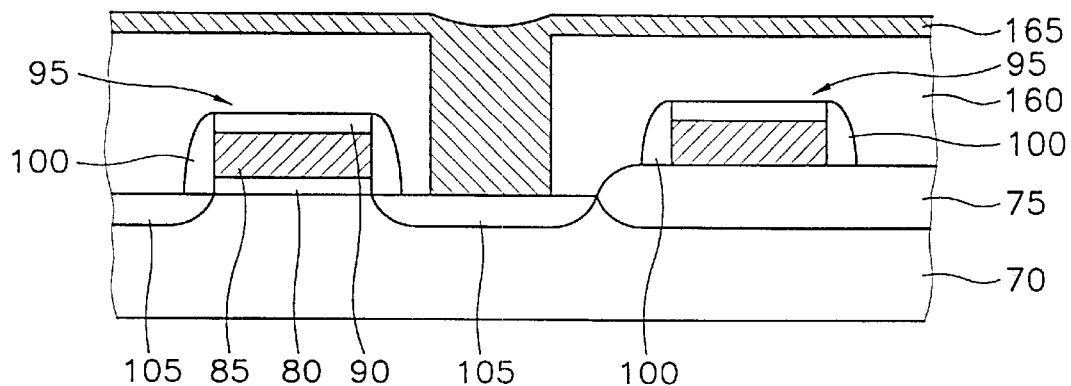
FIGS. 5A to 5D are sectional views illustrating a manufacturing process of a semiconductor device employing a capacitor of a second embodiment of the present invention.

Now, referring to FIG. 5A, an insulating interlayer 160 of BPSG or PSG is formed by low pressure chemical vapor deposition or plasma enhanced chemical vapor deposition on a substrate 70 having a gate electrode 95. The insulating interlayer 160 has a thickness of about 2000–10000 Å. Next, in preparation for the subsequent deposition and patterning processes, the upper portion of the insulating interlayer 160 is planarized by a chemical mechanical polishing (CMP) process.

In the present embodiment, although not shown, an etching protective layer of a nitride material can be formed on the top portion of the planarized insulating interlayer 160 to protect the insulating interlayer 160 from being etched during the subsequent the process of etching the sacrificial structure 115.

Then, the insulating interlayer 160 is selectively etched to form a contact hole exposing a source/drain region 105. A first conductive layer 165 filling the contact hole is formed on the insulating interlayer 160. The first conductive layer 165 is formed by depositing polysilicon using low pressure chemical vapor deposition.

Figure 5B:
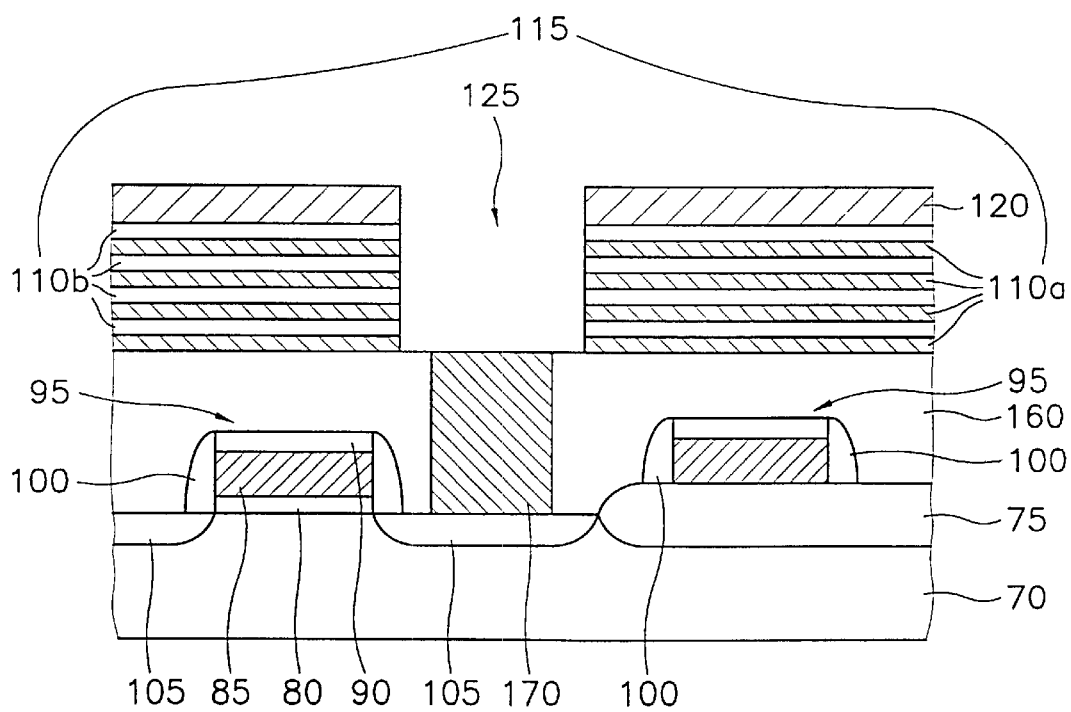

Referring to FIG. 5B, the first conductive layer 165 is etched back or chemically mechanically polished to form a contact plug 170 in the contact hole. The contact plug 170 contacts the source/drain region 105.

Next, a sacrificial structure 115 is formed on top of the contact plug 170 and the insulating interlayer 169. The sacrificial structure 15 comprises a number of oxide layers 110a and 110b having different etching rates in an etchant having an HF composition. The sacrificial structure is formed by any of the processes described in connection with Embodiment 1.

In the present embodiment, the oxide layers 110a and 110b are deposited on planarized top portions of the insulating interlayer 160 and the contact plug 170. Accordingly, the sacrificial structure 115 has a rather uniform configuration.

A photoresist pattern 120 is then formed on the sacrificial structure 115. Utilizing the photoresist pattern 120 as an etching mask, the sacrificial structure 115 is anistropically etched using a reactive ion etching method to form a hole 125 which exposes the contact plug 170.

Figure 5C:
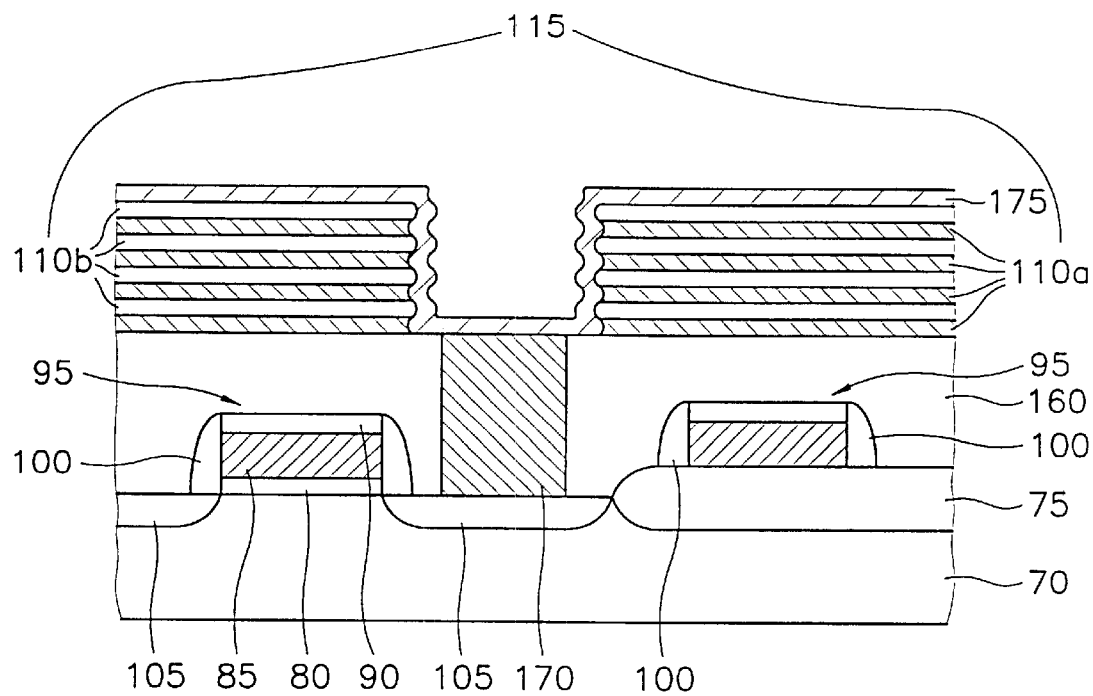

Referring to FIG. 5C, in the same manner as described in connection with Embodiment 1, the sacrificial structure 115 is etched by an etchant having an HF composition to form a series of tooth-like prominences and depressions at a side wall of the sacrificial structure 115 defining the hole 125.

After the photoresist pattern 120 is removed, polysilicon is deposited over the substrate 70 by low pressure chemical vapor deposition to form a second conductive layer 175.

Figure 5D:
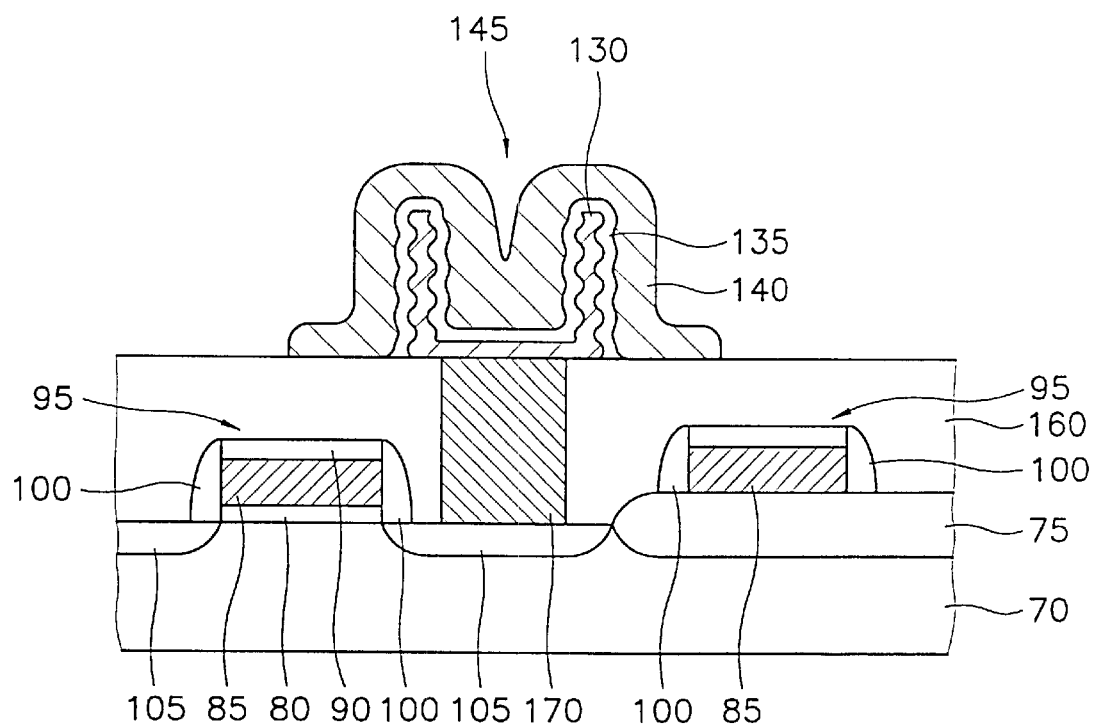

As shown by FIG. 5D, the sacrificial structure 115 is etched away to yield a storage electrode 130 having a side wall portion formed with tooth-like prominences and depressions and a bottom wall portion contacting the contact plug 170.

Thereafter, a dielectric film 135 and a plate electrode 140 are sequentially formed on the storage electrode 130 to produce a capacitor 145.

Also, as described in connection with Embodiment 1, a silicon HSG layer (not shown) may be formed on the inner side wall surface or on the entire exposed surface of the storage electrode 130 to further increase the storage capacitance of the capacitor.

Figure 6A:
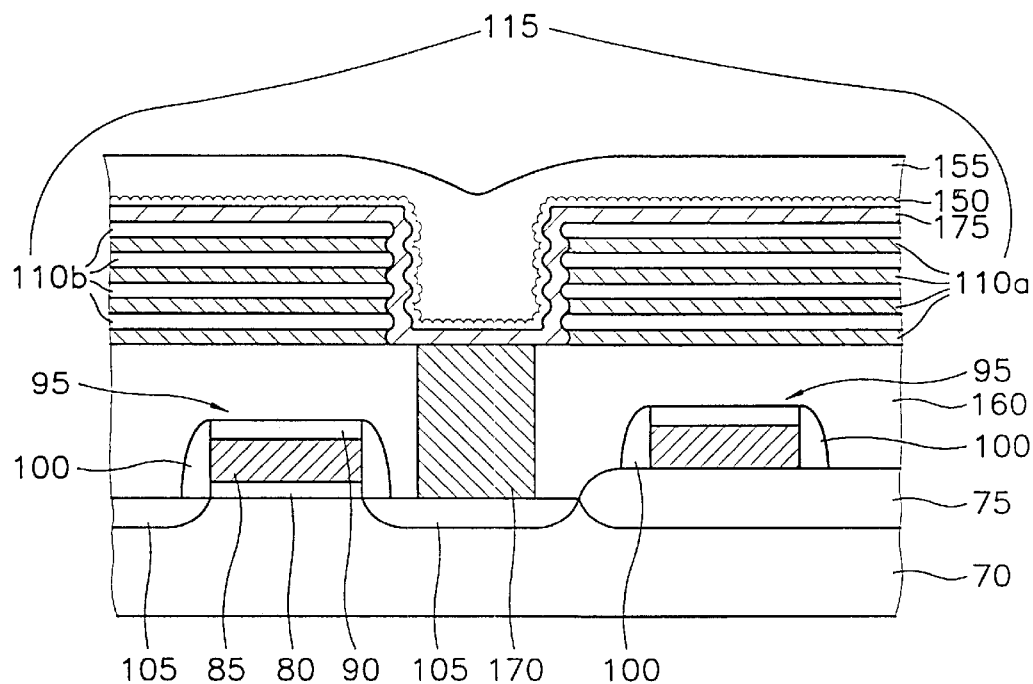
FIGS. 6A and 6B are sectional views illustrating a process of forming a HSG silicon layer on the surface of a storage electrode of the second embodiment of the present invention having a side wall shaped by a teeth-like prominences and depressions.
Figure 6B:
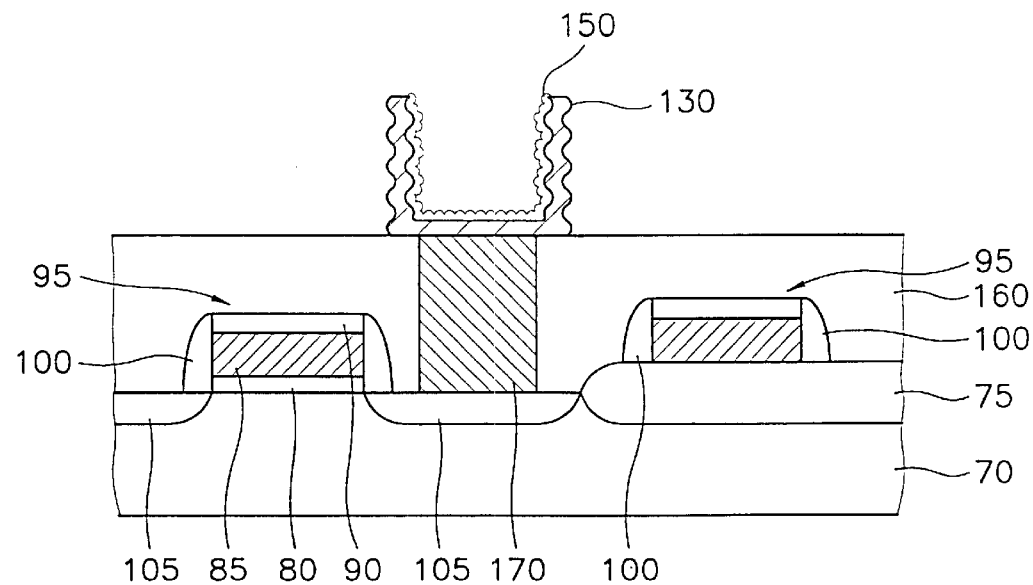

FIGS. 6A and 6B illustrate a storage electrode formed with such a silicon HSG layer. Referring to FIG. 6A, a silicon HSG layer 150 is formed on the surface of the second conductive layer 175. The process of forming the silicon HSG silicon layer 150 is described in detail in connection with Embodiment 1. Also, in the present Embodiment, a protective layer 155 of silicon oxide is formed on the silicon HSG layer 150.

Referring to FIG. 6B, the protective layer 155 and the sacrificial structure 115 are removed by wet-etching to yield a storage electrode 130 having a silicon HSG layer on top of its bottom wall portion and side wall portion.

Alternatively, but in accordance with the present invention, the storage electrode 130 can be produced prior to forming the silicon HSG silicon layer. In this case, the entire outer surface of the storage electrode 130 can be covered with the silicon HSG layer thereby further enhancing the storage capacitance of the capacitor 145.

In accordance with the present invention, the oxide layers of the sacrificial structure may be provided with impurities by implementing either an in situ doping method or an ion implantation method. The oxide layers may be doped with boron, phosphorus, or other impurities such that the side wall of the sacrificial structure will be anisitropically etched by an etchant having a composition comprising hydrofluoric acid (HF). The resultant storage electrode has a relatively large surface area, rendering a capacitor with a markedly increased storage capacitance.

Generally speaking, the higher the amount or concentration of boron in BPSG, the higher the conductivity of the BPSG; however, the higher the amount or concentration of boron in BPSG, the lower the etching rate of the BPSG when etched by an etchant having an HF composition. In other words, the etching rate of BPSG is inversely proportional to the amount or concentration of boron in the BPSG. On the contrary, the etching rate of BPSG is directly proportional to the amount or concentration of phosphorus in the BPSG.

Accordingly, when a multi-layered structure comprising alternating BPSG layers having different etching rates are etched by an etchant having $HF:H_2O$ in a ratio of about 1:1 to 2:1 for 20 to 40 seconds, the BPSG layer having relatively more boron will exhibit less etching activity compared to the BPSG layer having relatively more phosphorus.

Nonetheless, due to inherent physical properties of BPSG, BPSG layers having different concentrations of impurities only exhibit slight differences in etching rate in comparison to other oxide and nitride layer compositions. Thus, utilizing this slight difference in etching rate of BPSG layers having varying amounts of boron and or phosphorus, a sacrificial structure having a fine series of tooth-like prominences and depressions at its side wall can be realized.

Similarly, as concerns the phosphorus content in PSG, the higher the amount or concentration of the phosphorous dopant in the silicate glass, the higher its etching rate when etched by an etchant having an HF composition. In view of the inherent physical properties of, PSG and various problems associated with its manufacturing process, it is well known in the art that silicate glass can be doped with a maximum of 12% by weight of phosphorus. Accordingly, PSG layers can be formed with only limited differing amounts of phosphorus. When such layers are used to form the sacrificial structure, a series of fine tooth-like prominences and depressions can thus also be realized.

Also, as has been described earlier, the first and second oxide layers may be USG and PSG layers, USG and BPSG layers, or BPSG and PSG layers. Furthermore, the multi-layered sacrificial structure may comprise USG, BPSG, and PSG layers. In this case, USG layers exhibit less etching activity compared to the BPSG and PSG layers in an etchant having an HF composition. In order to produce a desirable series of irregular tooth-like prominences and depressions, USG and BPSG layers should be formed prior to forming USG and PSG layers, or conversely, USG and PSG layers should be formed before forming USG and BPSG layers.

Although the present invention has been shown and described with reference to particular examples thereof, various changes thereto and modifications thereof will become readily apparent to those of ordinary skill in the art. All such changes and modifications are seen to be within the true spirit and scope of the invention as defined by the appended claims.

What is claimed is:

1. A method of manufacturing a capacitor, comprising the steps of:

forming a number of oxide layers one on top of the other over a substrate at a temperature of no more than 600° C. with a difference in impurities being provided between the oxide layers of each adjacent pair thereof, each one of the oxide layers of an adjacent pair exhibiting a different etching rate, when exposed to an etchant, from the other of the oxide layers of the adjacent pair due to the difference in the impurities contained in the oxide layers, and the oxide layers collectively constituting a multi-layered sacrificial structure;

forming at least one hole in the sacrificial structure, whereby the sacrificial structure has a side wall portion delimiting the hole;

etching the side wall of the sacrificial structure with said etchant to thereby etch the oxide layers at different rates and form a repeating series of tooth-like prominences and depressions at the side wall of the sacrificial structure;

depositing conductive material over the series of tooth-like prominences and depressions such that the series of tooth-like prominences and depressions is reproduced in the conductive material and thereby forming a first conductive layer;

removing the sacrificial structure after the first conductive layer is formed; and sequentially forming a dielectric film and a second conductive layer over the first conductive layer, wherein the forming of the oxide layers comprises forming alternating layers of a first BPSG having a first boron:phosphorus composition in a weight percent ratio of about 1:1 and a second BPSG having a boron:phosphorus composition in a weight percent ratio of about 1.2–2.0:1.

2. A method of manufacturing a capacitor as claimed in claim 1, wherein the etchant has a composition comprising hydrofluoric acid (HF).

3. A method of manufacturing a capacitor as claimed in claim 2, wherein the forming of the at least one hole exposes the substrate, and the etching of the side wall is carried out with the substrate exposed, whereby the etchant cleans the substrate prior to the formation of the first conductive layer.

4. A method of manufacturing a capacitor as claimed in claim 1, wherein the forming of the oxide layers of the sacrificial structure comprises in situ doping of an oxide.

5. A method of manufacturing a capacitor as claimed in claim 1, wherein the forming of the oxide layers of the sacrificial structure comprises ion implantation of impurities into an oxide.

6. A method of manufacturing a capacitor as claimed in claim 1, wherein the forming of the oxide layers is carried out until each of the oxide layers has a thickness of about 100–1000 Å.

7. A method of manufacturing a capacitor as claimed in claim 1, wherein the forming of the oxide layers comprises forming the layers of at least one oxide material selected from the group consisting of BPSG, PSG, and USG.

8. A method of manufacturing a capacitor as claimed in claim 1, and further comprising a step of forming a silicon HSG layer on a surface of the first conductive layer.

9. A method of manufacturing a capacitor as claimed in claim 8, and further comprising a step of forming a protective layer on the silicon HSG layer before the sacrificial structure is removed, whereby the protective layer protects the HSG layer during the removing of the sacrificial structure.

10. A method of manufacturing a capacitor as claimed in claim 1, wherein the forming of the oxide layers comprises forming the layers using low pressure chemical vapor deposition carried out at a temperature within a range of 400–600° C.

11. A method of manufacturing a capacitor as claimed in claim 1, wherein the forming of the oxide layers comprises forming the layers using plasma enhanced chemical vapor deposition carried out at a temperature within a range of 400–600° C.

12. A method of manufacturing a capacitor, comprising the steps of:

forming a number of oxide layers one on top of the other over a substrate at a temperature of no more than 600° C. with a difference in impurities being provided between the oxide layers of each adjacent pair thereof, each one of the oxide layers of an adjacent pair exhibiting a different etching rate, when exposed to an etchant, from the other of the oxide layers of the adjacent pair due to the difference in the impurities contained in the oxide layers, and the oxide layers collectively constituting a multi-layered sacrificial structure;

forming at least one hole in the sacrificial structure, whereby the sacrificial structure has a side wall portion delimiting the hole;

etching the side wall of the sacrificial structure with said etchant to thereby etch the oxide layers at different rates and form a repeating series of tooth-like prominences and depressions at the side wall of the sacrificial structure;

depositing conductive material over the series of tooth-like prominences and depressions such that the series of tooth-like prominences and depressions is reproduced in the conductive material and thereby forming a first conductive layer;

removing the sacrificial structure after the first conductive layer is formed; and sequentially forming a dielectric film and a second conductive layer over the first conductive layer, wherein the forming of the oxide layers comprises forming alternating layers of a first PSG and a second PSG both having phosphorus in a weight percent ratio of about 1.4–3.0:1.

* * * * *